United States Patent
Tong

(10) Patent No.: US 9,147,739 B2
(45) Date of Patent: Sep. 29, 2015

(54) METHOD OF FORMING POLYSILICON IN A TRENCH

(71) Applicant: Silergy Semiconductor Technology (Hangzhou) Ltd., Hangzhou (CN)

(72) Inventor: Liang Tong, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 14/302,753

(22) Filed: Jun. 12, 2014

(65) Prior Publication Data

US 2014/0370700 A1 Dec. 18, 2014

(30) Foreign Application Priority Data

Jun. 14, 2013 (CN) .......................... 2013 1 0238394

(51) Int. Cl.
*H01L 21/311* (2006.01)
*H01L 29/423* (2006.01)
*H01L 21/321* (2006.01)

(52) U.S. Cl.
CPC ...... *H01L 29/4236* (2013.01); *H01L 21/32115* (2013.01)

(58) Field of Classification Search
CPC ............ H10L 21/762; H10L 21/76205; H10L 21/76831; H10L 21/3105; H10L 21/76877; H10L 21/2807; H10L 21/76224; H10L 21/31608; H10L 21/31658; H10L 21/3212; H10L 21/31695; H10L 21/32055; H10L 21/7624; H01L 23/53271; H01L 23/4825; H01L 29/04; H01L 29/78663
USPC ......... 438/700, 692, 657, 723, 752, 753, 667, 438/668, 786, 787, 417, 211, 96, 97; 257/E21.006, E21.009, E21.102, 257/E21.115, E21.193, E21.229, E21.278, 257/E21.304, E21.32, E21.416, E21.545, 257/E21.547, E21.564, E21.561
See application file for complete search history.

(56) References Cited

U.S. PATENT DOCUMENTS

| | | | | |
|---|---|---|---|---|
| 6,903,013 | B2 * | 6/2005 | Chan et al. .................... | 438/678 |
| 6,921,697 | B2 * | 7/2005 | Darwish et al. ............... | 438/270 |
| 7,238,568 | B2 * | 7/2007 | Williams et al. .............. | 438/243 |
| 7,276,411 | B2 * | 10/2007 | Williams et al. .............. | 438/243 |
| 2009/0230455 | A1 * | 9/2009 | Zhu ............................... | 438/261 |

FOREIGN PATENT DOCUMENTS

| | | |
|---|---|---|
| CN | 102832242 A | 12/2012 |
| CN | 103199053 A | 7/2013 |
| CN | 103413765 A | 11/2013 |

OTHER PUBLICATIONS

Office Action for Chinese Patent Application No. 201310238394.X, dated May 28, 2015, 5 pages.

* cited by examiner

*Primary Examiner* — David Nhu
(74) *Attorney, Agent, or Firm* — Westman, Champlin & Koehler, P.A.

(57) ABSTRACT

Disclosed herein are methods for forming polysilicon in a trench. The sacrificial layer having a high etching rate is applied on the surface of polysilicon after polysilicon is formed on the surface of the substrate and in the trench. The sacrificial layer can provide a flat surface. With the sacrificial layer as a sacrificial mask layer, polysilicon can be etched as having a flat surface. The present disclosure avoids using the CMP process, simplifies the manufacturing process, and reduces the production cost. Moreover, the oxide layer formed thereafter can meet the requirement of current applications.

9 Claims, 4 Drawing Sheets

METHOD OF FORMING POLYSILICON IN A TRENCH

RELATED APPLICATIONS

This application claims the benefit of Chinese Patent Application No. 201310238394.X, filed on Jun. 14, 2013, which is incorporated herein by reference in its entirety.

TECHNICAL FIELD

The present disclosure generally relates to the field of semiconductor devices, and more particularly, to a method for forming polysilicon in a trench.

BACKGROUND

As power devices, trench-type MOS power devices, each having a bilayer gate in a trench, provide the advantages of a higher breakdown voltage, a lower on resistance and a faster switching speed. Normally, a first layer of polysilicon is grounded, and a second layer of polysilicon is used as a gate conductor. An oxide layer is arranged between the two layers of polysilicon, and has a thickness which is well controlled for preventing leakage current and a low breakdown voltage.

Referring to FIGS. 1 and 2, in a conventional process for forming a trench-type MOS power device, a trench is firstly formed in a substrate 10. An oxide layer 20 is then formed in the trench and on a surface of the substrate 10. A first layer 30 of polysilicon is then formed in the trench and on the surface of the substrate 10. The first layer 30 of polysilicon is then etched to remove the portion of the first layer 30 of polysilicon that is on the surface of the substrate 10. Meanwhile, the portion of the first layer 30 of polysilicon in the trench is etched to a predetermined depth below the surface of the substrate 10.

However, in a case that the trench has a large depth, there is usually a recess 31 in the first layer 30 of polysilicon above the trench when the first layer 30 of polysilicon is formed in the trench and on the surface of the substrate 10, as shown in FIG. 1. The recess 31 remains in the portion of the first layer 30 of polysilicon in the trench after the first layer 30 of polysilicon is etched, as show in FIG. 2. After the oxide layer is formed, portions of the oxide layer near corners of the first layer 30 of polysilicon have poor quality and a thickness that is not well controlled. Consequently, the power device will have leakage current and a low breakdown voltage.

In a conventional process, the first layer 30 of polysilicon may be planarized by chemical mechanical polishing (CMP) to remove the recess 31, followed by etching. However, it makes the process complex and leads to increased cost.

SUMMARY

The object of the present disclosure is to provide a method for forming polysilicon having a flat surface in a trench.

To achieve the object, the present disclosure provides a method for forming polysilicon in a trench, comprising:

providing a substrate;
forming a first dielectric layer on the substrate;
forming an opening in the first dielectric layer by etching;
forming a trench in the substrate by etching through the opening;
forming a second dielectric layer on sidewalls of the trench;
forming polysilicon on a surface of the substrate and on a surface of the second dielectric layer in the trench;
applying a sacrificial layer on a surface of polysilicon; and
removing the sacrificial layer and the portion of polysilicon on the surface of the substrate successively by etching, while the portion of polysilicon remaining in the trench may be etched to a predetermined depth below the surface of the substrate.

Preferably, the sacrificial layer may be made of photoresist or spin-on glass.

Preferably, the sacrificial layer has a thickness in the range between 2000 angstroms and 2 micrometers.

Preferably, the first dielectric layer may be made of silicon oxide.

Preferably, the first dielectric layer has a thickness in the range between 10 angstroms and 5000 angstroms.

Preferably, the step of forming the first dielectric layer comprises forming a mask layer on the first dielectric layer.

Preferably, the mask may be a patterned photoresist layer.

Preferably, the mask layer has a thickness in the range between 100 angstroms and 8000 angstroms.

Preferably, the second dielectric layer may be made of silicon oxide.

Preferably, the second dielectric layer has a thickness in the range between 100 angstroms and 8000 angstroms.

The present disclosure can advantageously provide several advantages over conventional approaches. The sacrificial layer having a high etching rate may be applied on the surface of polysilicon after polysilicon is formed on the surface of the substrate and in the trench. The sacrificial layer can provide a flat surface. With the sacrificial layer as a sacrificial mask layer, polysilicon can be etched as having a flat surface. The present disclosure avoids using a CMP process, simplifies the manufacturing process, and reduces the production cost. Moreover, the oxide layer formed thereafter can meet the requirement of current applications.

DESCRIPTION OF EMBODIMENTS

Reference may now be made in detail to particular embodiments of the present disclosure for forming polysilicon in a trench, examples of which are illustrated in the accompanying drawings. Other advantages and features of the present disclosure will become readily apparent from claims and the detailed description of preferred embodiments below. The accompanying drawings are illustrative and not intended to be limiting, but are examples of embodiments of the disclosure, are simplified for explanatory purposes, and are not drawn to scale.

Figure 1:
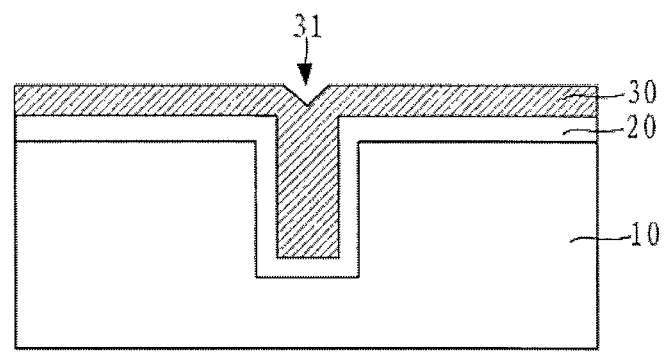
FIG. 1 is a schematic diagram of an example structure in which a first polysilicon is formed on a substrate and in a trench.
Figure 2:
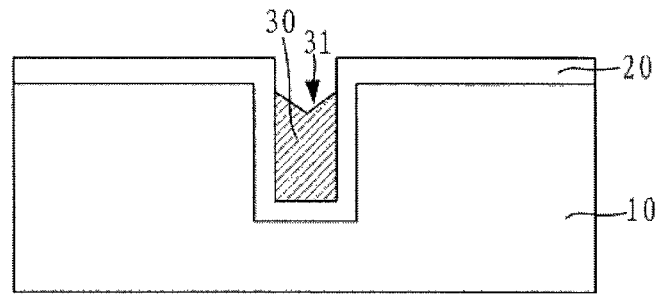
FIG. 2 is a schematic diagram of an example structure after a first polysilicon is formed.
Figure 3:
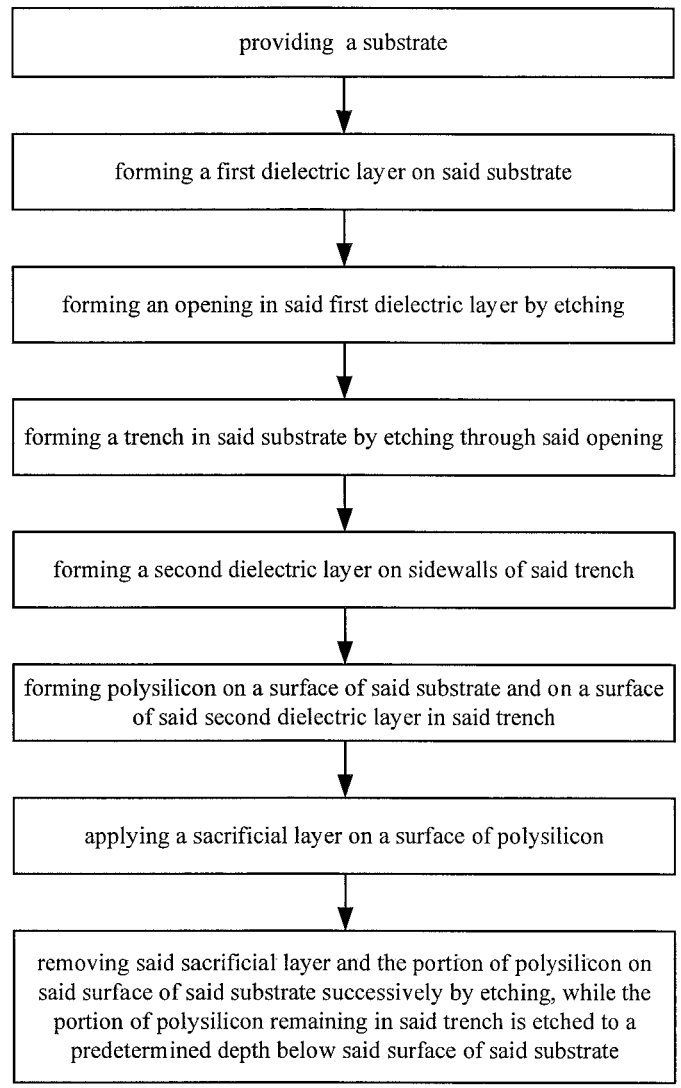
FIG. 3 is a flowchart of an example method for forming polysilicon in a trench in accordance with an embodiment of the present disclosure.

Referring to FIG. 3, the present embodiment provides a method for forming polysilicon in a trench, comprising the following steps.

A substrate 100 is firstly provided.

The substrate 100 may be one selected from a group consisting of monocrystalline silicon, polysilicon, amorphous silicon, SiGe, silicon on insulator (SOI), and the like.

Figure 4:
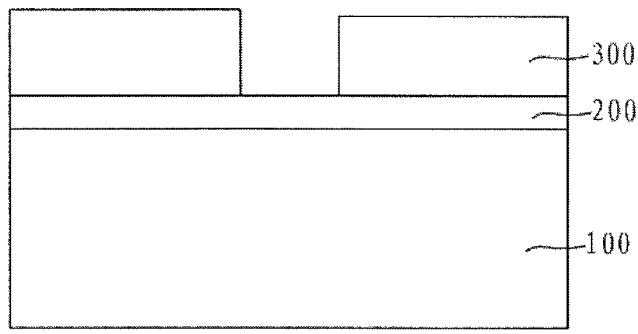
FIGS. 4 to 10 are cross-sectional views of an example structure in which polysilicon is formed in a trench in accordance with an embodiment of the present disclosure.

A first dielectric layer 200 and a mask layer 300 may be formed successively on the substrate 100, as shown in FIG. 4.

The first dielectric layer 200 may be made of silicon oxide, and have a thickness in the range between 10 angstroms and 5000 angstroms, for example, 500 angstroms. As an etching stop layer, the mask layer 300 may be a patterned photoresist layer, and have a thickness in the range between 1000 angstroms and 2 micrometers, for example, 5000 angstroms. The mask layer 300 will be used for forming an opening by etching in a subsequent step.

Figure 5:
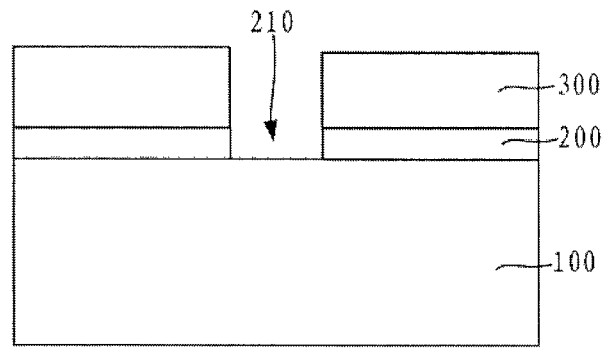

Specifically, an opening 210 may be formed by etching the first dielectric layer 200, as shown in FIG. 5.

Figure 6:
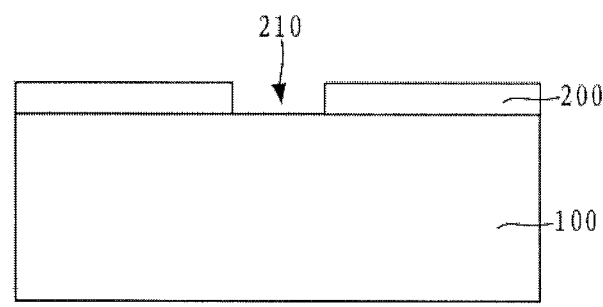

After forming the opening 210 by etching, the mask layer 300 may be removed, as shown in FIG. 6.

Figure 7:
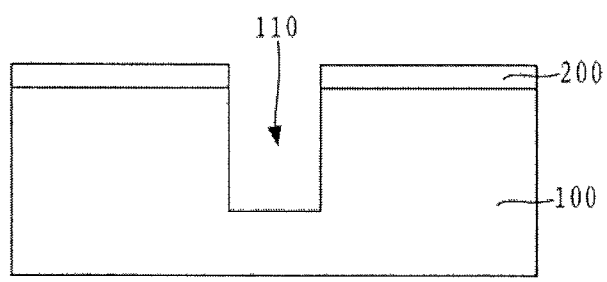

A trench 110 may be then formed in the substrate 100 by etching through the opening 210, as shown in FIG. 7.

With the first dielectric layer 200 as shield, a trench 110 may be formed in the substrate 100 through the opening 210.

Figure 8:
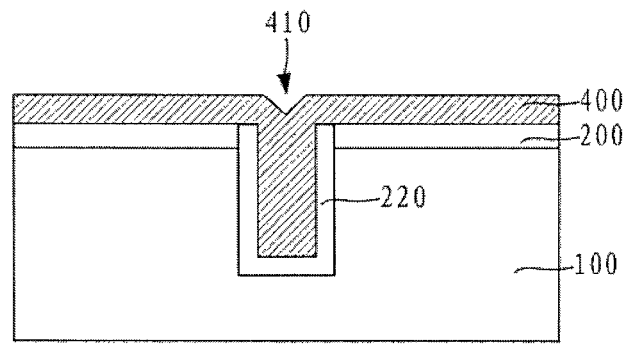

A second dielectric layer 220 may be formed on sidewalls of the trench 110, as shown in FIG. 8.

The second dielectric layer 220 may be made of silicon oxide, and have a thickness between 100 angstroms and 8000 angstroms, for example, 500 angstroms. The second dielectric layer 220 may be used for separating polysilicon from the substrate 100, and also used as a buffer layer.

Polysilicon 400 may be formed on a surface of the first dielectric layer 200, and on a surface of the second dielectric layer 220 in the trench 110, as shown in FIG. 8.

Polysilicon 400 covers the surface of the first dielectric layer 200. Because the trench 110 has a large depth, there may be a recess 410 in polysilicon 400 above the trench 110.

Figure 9:
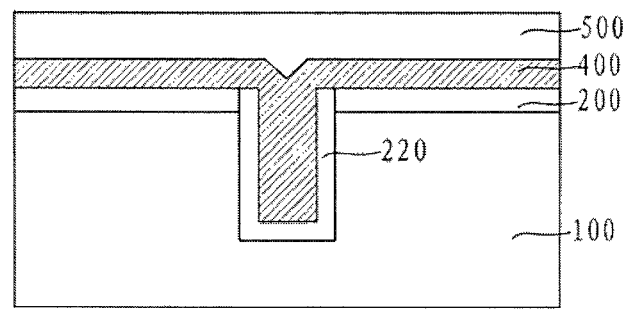

A sacrificial layer 500 may be applied to a surface of polysilicon 400, as shown in FIG. 9.

The sacrificial layer 500 may be made of photoresist or spin-on glass (SOG), and have a thickness in the range between 2000 angstroms and 2 micrometers, for example, 5000 angstroms. SOG is a mixture of silicon dioxide and a volatile solvent, which is a soft material and has high flowability. Photoresist or SOG is soft and has high flowability and high filling property, it can provide a flat surface and having a high etching rate. Consequently, the photoresist or SOG can be easily etched. The sacrificial layer 500 may have a thickness dependent on a depth of the recess 410. The larger the thickness of the recess 410 is, the larger the thickness of the sacrificial layer 500 is, so that polysilicon can be formed in a subsequent step as having a flat surface.

Figure 10:
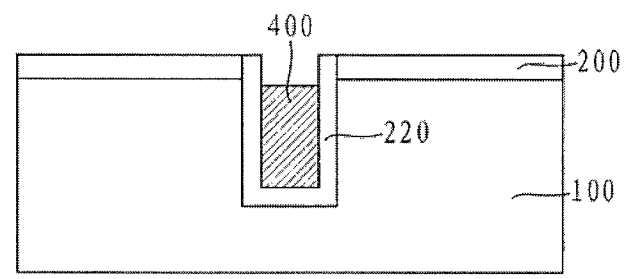

By etching the sacrificial layer 500 and polysilicon 400, the portion of polysilicon 400 on the first dielectric layer 200 may be removed, and the portion of polysilicon 400 in the trench 110 may be etched to a predetermined depth below the surface of the substrate 100, as shown in FIG. 10.

Because the sacrificial layer 500 formed above has a flat surface, polysilicon 400 has a flat surface free of the recess after etching.

To sum up, in the above embodiments of the present disclosure, the method for forming polysilicon in a trench is provided. The sacrificial layer having a high etching rate may be applied on the surface of polysilicon after polysilicon is formed on the surface of the substrate and in the trench. The sacrificial layer can provide a flat surface. With the sacrificial layer as a sacrificial mask layer, polysilicon can be etched as having a flat surface. The oxide layer formed thereafter can meet the requirement of current applications.

The foregoing descriptions of specific embodiments of the present disclosure have been presented for purposes of illustration and description. They are not intended to be exhaustive or to limit the disclosure to the precise forms disclosed. Many modifications and variations may be readily apparent to one skilled in the art in light of the above teaching. It is intended that the scope of the disclosure be defined by the claims appended hereto and their equivalents.

What is claimed is:

1. A method for forming polysilicon in a trench, comprising:
   providing a substrate;
   forming a first dielectric layer on said substrate;
   forming an opening in said first dielectric layer by etching;
   forming a trench in said substrate by etching through said opening;
   forming a second dielectric layer on sidewalls of said trench;
   forming polysilicon on a surface of said substrate and on a surface of said second dielectric layer in said trench;
   applying a sacrificial layer made of photoresist or spin-on glass on a surface of polysilicon to provide a flat surface; and
   removing said sacrificial layer and a portion of polysilicon on said surface of said substrate successively by etching, while a portion of polysilicon remaining in said trench is etched to a predetermined depth below said surface of said substrate.

2. The method according to claim 1, wherein said sacrificial layer has a thickness in the range between 200 angstroms and 2 micrometers.

3. The method according to claim 1, wherein said first dielectric layer is made of silicon oxide.

4. The method according to claim 3, wherein said first dielectric layer has a thickness in the range between 10 angstroms and 5000 angstroms.

5. The method according to claim 1, wherein after forming said first dielectric layer and before forming said opening, further comprises forming a mask layer on said first dielectric layer.

6. The method according to claim 5, wherein said mask layer is a patterned photoresist layer.

7. The method according to claim 5, wherein said mask layer has a thickness in the range between 100 angstroms and 8000 angstroms.

8. The method according to claim 1, wherein said second dielectric layer is made of silicon oxide.

9. The method according to claim 8, wherein said second dielectric layer has a thickness in the range between 100 angstroms and 8000 angstroms.

* * * * *